United States Patent
Schmidt et al.

(10) Patent No.: US 10,147,824 B2
(45) Date of Patent: Dec. 4, 2018

(54) DETECTOR COMPRISING A VARIABLE CAPACITANCE DIODE

(71) Applicant: HELMHOLTZ-ZENTRUM DRESDEN-ROSSENDORF E.V., Dresden (DE)

(72) Inventors: Heidemarie Schmidt, Dresden (DE); Ilona Skorupa, Dresden (DE); Slawomir Prucnal, Dresden (DE); Danilo Buerger, Dresden (DE); Agnieszka Bogusz, Freiberg (DE); Laveen Selvaraj, Chemnitz (DE)

(73) Assignee: Helmholtz-Zentrum Dresden-Rossendorf e.V., Dresden (DE)

( * ) Notice: Subject to any disclaimer, the term of this patent is extended or adjusted under 35 U.S.C. 154(b) by 150 days.

(21) Appl. No.: 15/124,075

(22) PCT Filed: Jan. 26, 2015

(86) PCT No.: PCT/DE2015/010029
§ 371 (c)(1),
(2) Date: Sep. 7, 2016

(87) PCT Pub. No.: WO2015/131877
PCT Pub. Date: Sep. 11, 2015

(65) Prior Publication Data
US 2017/0025552 A1    Jan. 26, 2017

(30) Foreign Application Priority Data

Mar. 7, 2014 (DE) .................. 10 2014 003 039
Apr. 22, 2014 (DE) .................. 10 2014 105 639

(51) Int. Cl.
*H01L 29/93*    (2006.01)
*H01L 27/10*    (2006.01)
(Continued)

(52) U.S. Cl.
CPC ............ *H01L 29/93* (2013.01); *H01G 7/025* (2013.01); *H01L 27/101* (2013.01);
(Continued)

(58) Field of Classification Search
CPC combination set(s) only.
See application file for complete search history.

(56) References Cited

U.S. PATENT DOCUMENTS 5,524,092 A    6/1996 Park
2007/0138522 A1    6/2007 Kijima et al.
(Continued)

FOREIGN PATENT DOCUMENTS

WO    2011129766 A1    10/2011

OTHER PUBLICATIONS

Tang, M.H., et al., "Capacitance-voltage and retention characteristics of Pt/SrBi2Ta2O9/HfO2/Si structures with various buffer layer thickness", Applied Physics Letters, May 29, 2009, vol. 94.
(Continued)

*Primary Examiner* — Ratisha Mehta
(74) *Attorney, Agent, or Firm* — Laurence A. Greenberg; Werner H. Stemer; Ralph E. Locher

(57) ABSTRACT

A capacitance diode or variable capacitance diode includes first and second electrodes and a layer configuration disposed in contact-making fashion between the two electrodes. The layer configuration has, one after the other in a direction from the first electrode towards the second electrode, a layer formed of a ferroelectric material and an electrically insulating layer formed of a dielectric material having electrically charged defects. A method for producing a capacitance diode or a variable capacitance diode, a storage device and a detector including a capacitance diode or a variable capacitance diode are also provided.

7 Claims, 12 Drawing Sheets

(51) Int. Cl.
  *H01L 29/861*     (2006.01)
  *H01L 49/02*      (2006.01)
  *H01G 7/02*       (2006.01)
  *H01L 27/11507*   (2017.01)
  *H01L 31/09*      (2006.01)
  *H01L 31/10*      (2006.01)
  *H01L 27/102*     (2006.01)

(52) U.S. Cl.
  CPC ........ *H01L 27/11507* (2013.01); *H01L 28/56* (2013.01); *H01L 29/8616* (2013.01); *H01L 31/09* (2013.01); *H01L 31/10* (2013.01); *H01L 27/1021* (2013.01)

(56) References Cited

U.S. PATENT DOCUMENTS

| | | | |
|---|---|---|---|
| 2008/0107885 A1* | 5/2008 | Alpay | H01L 28/56 428/220 |
| 2013/0026382 A1* | 1/2013 | Yao | H01L 31/022466 250/372 |

OTHER PUBLICATIONS

You, T., et al., "Exploiting Memristive BiFeO3 Bilayer Structures for Compact Sequential Logics", Advanced Functional Materials, Jun. 11, 2014, pp. 3357-3365, vol. 24, No. 22.

Zheng, X.J., et al., "Evaluation of capacitance-voltage characteristic and memory window of metal-ferroelectric-insulator-silicon capacitors", Applied Physics Letters, Nov. 24, 2008, vol. 93.

* cited by examiner

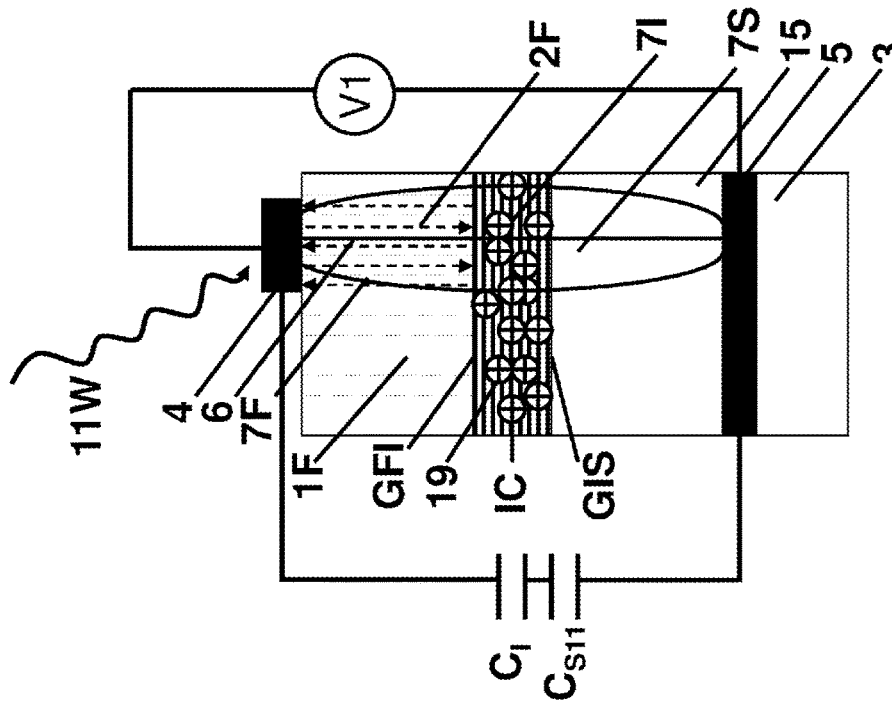
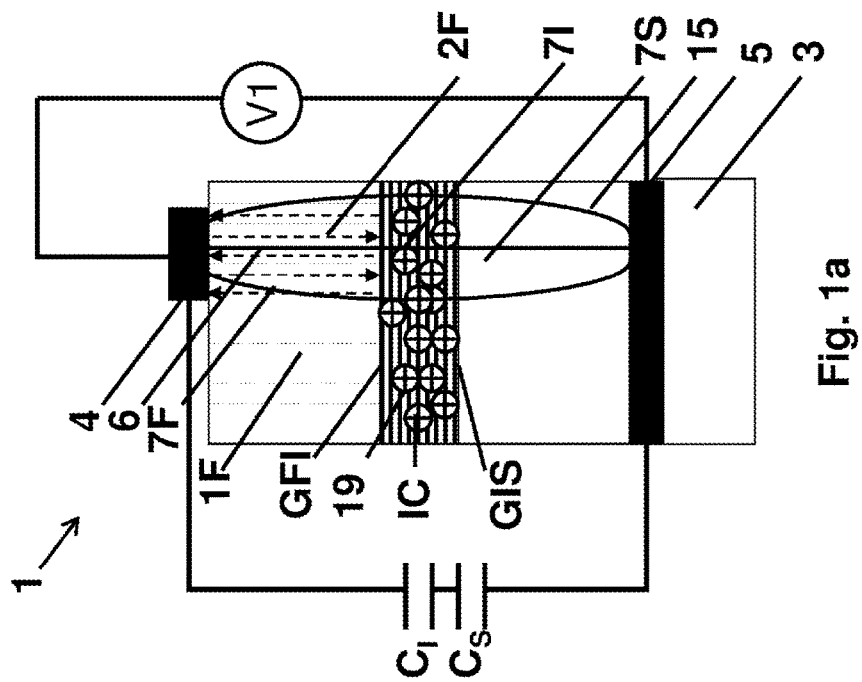

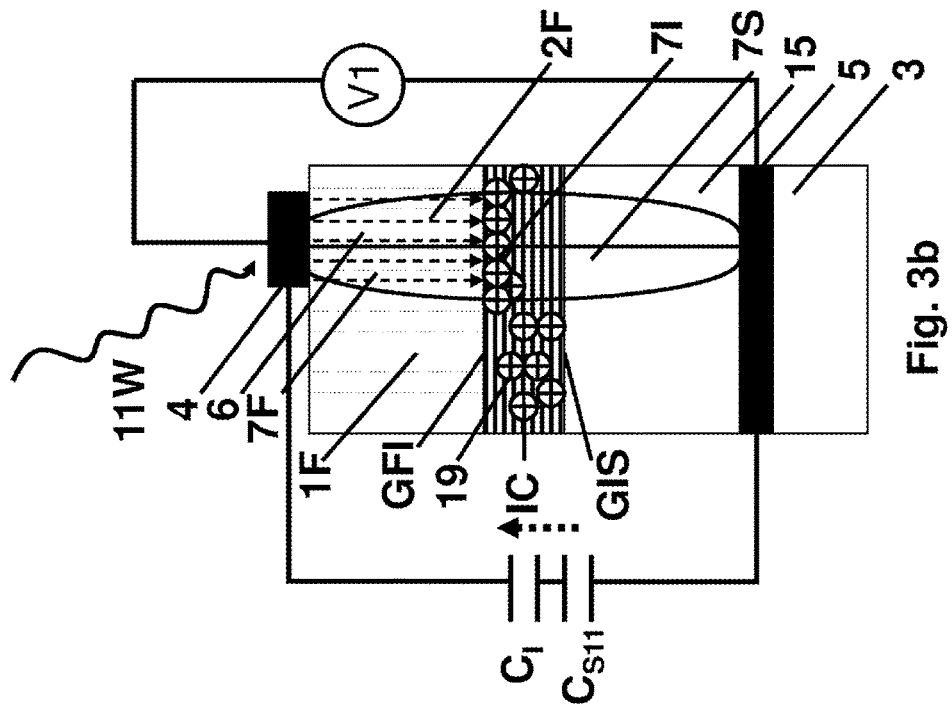
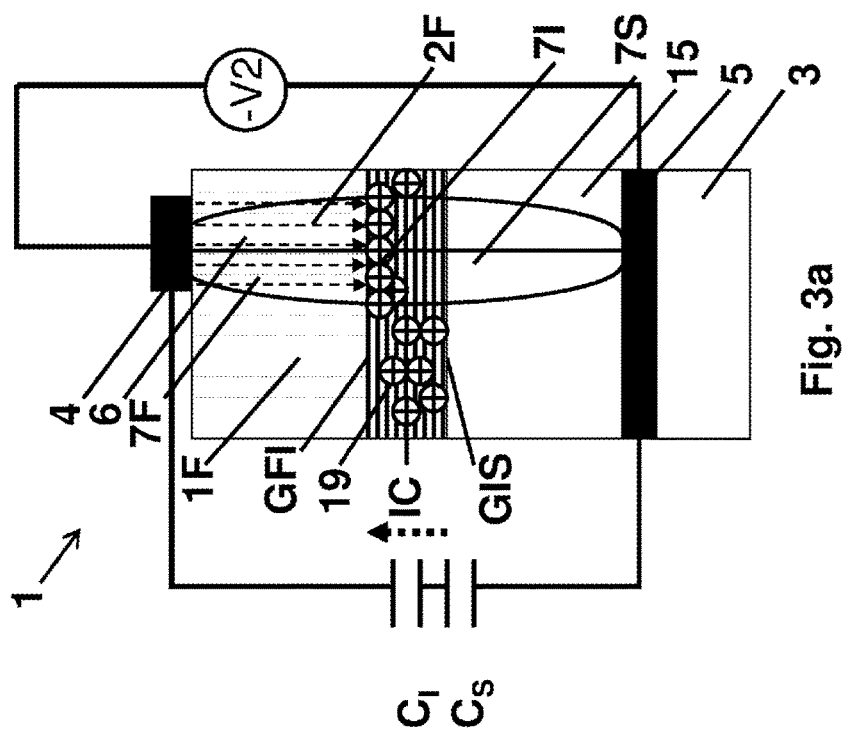

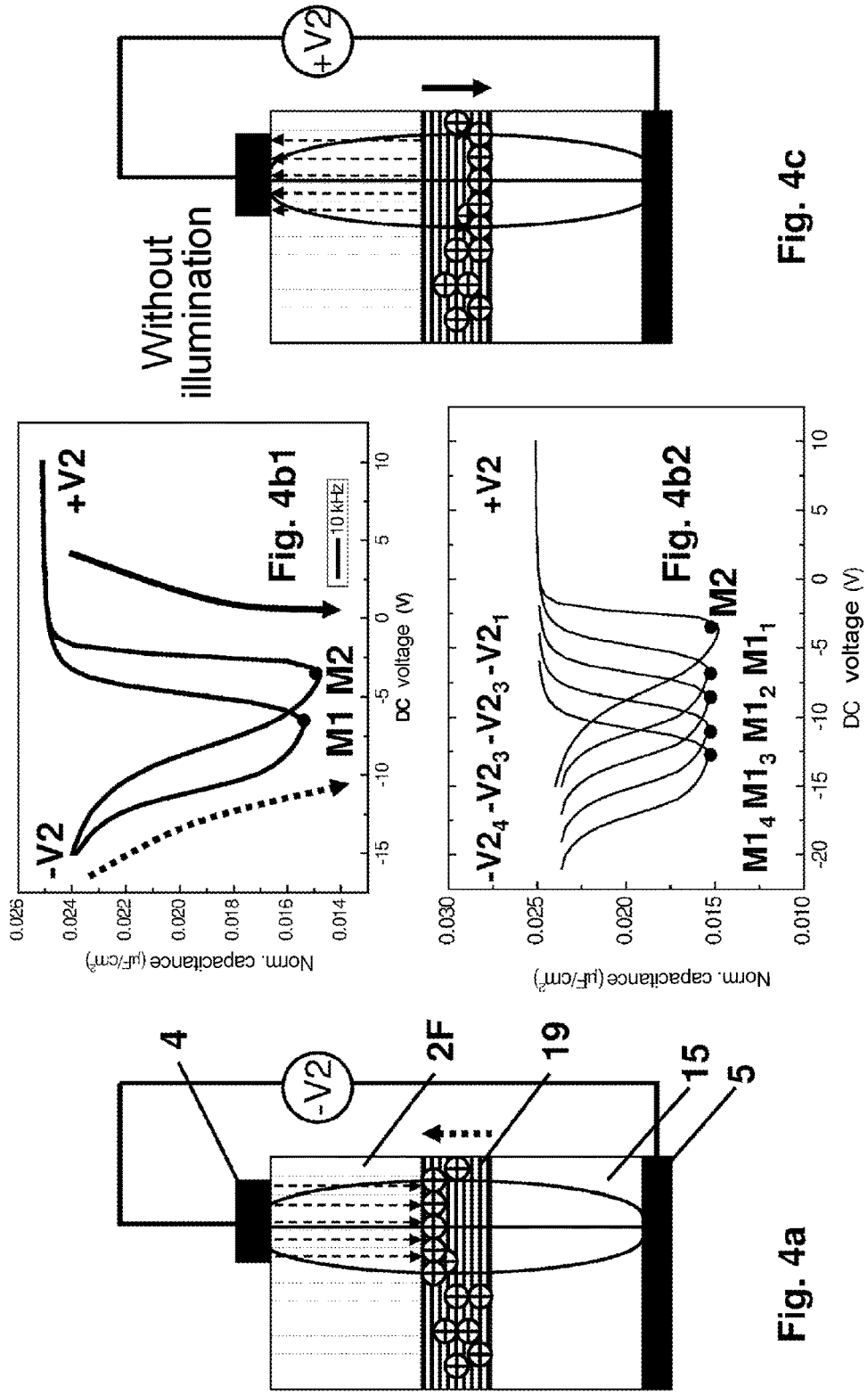

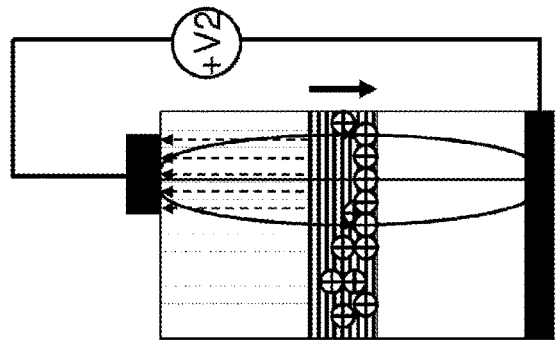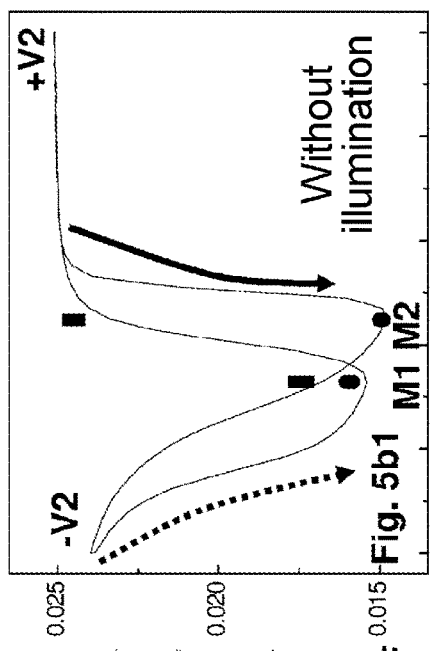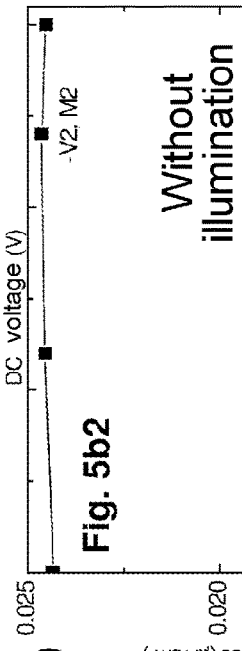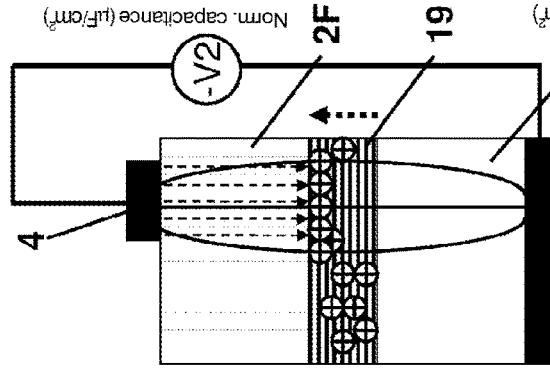

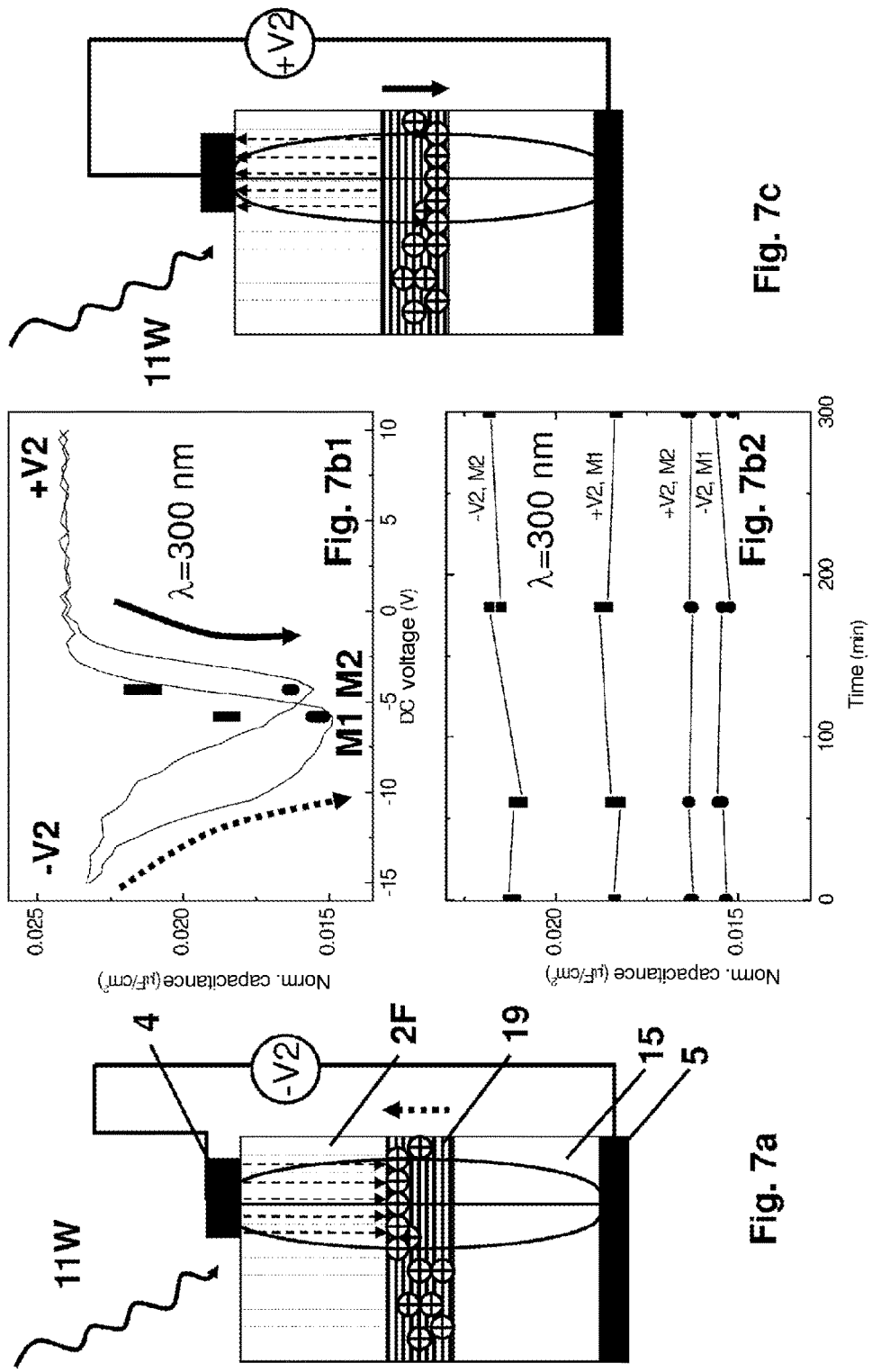

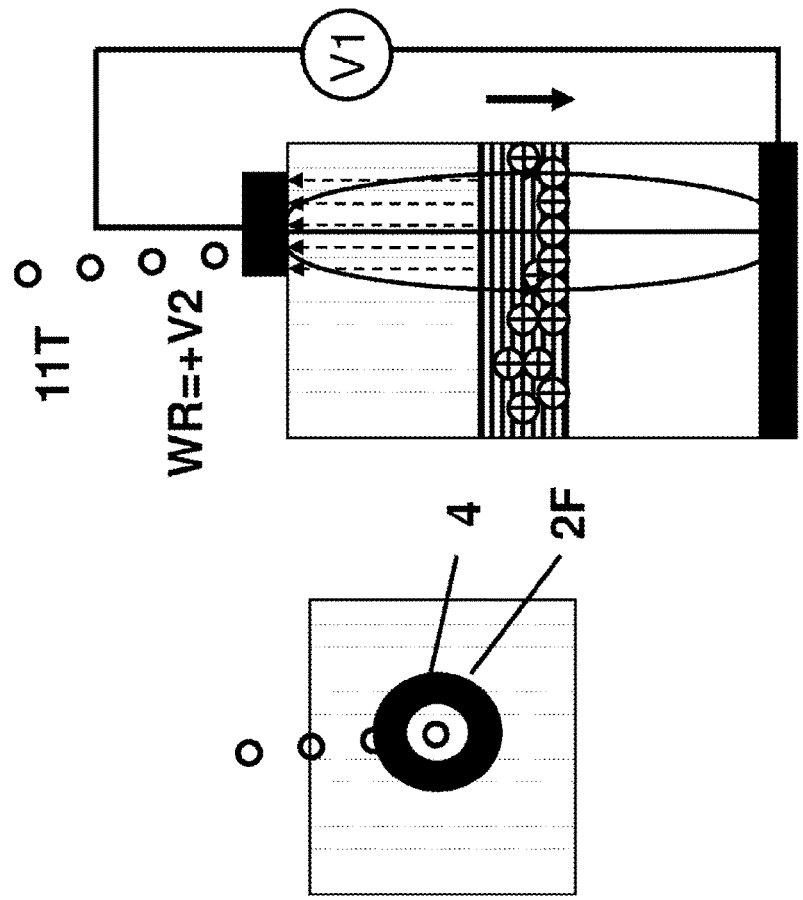
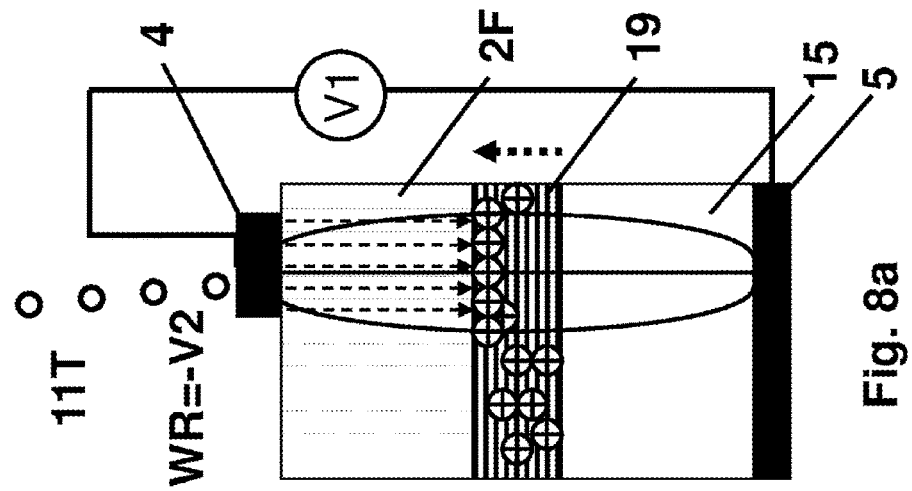
Fig. 8a  Fig. 8b  Fig. 8c

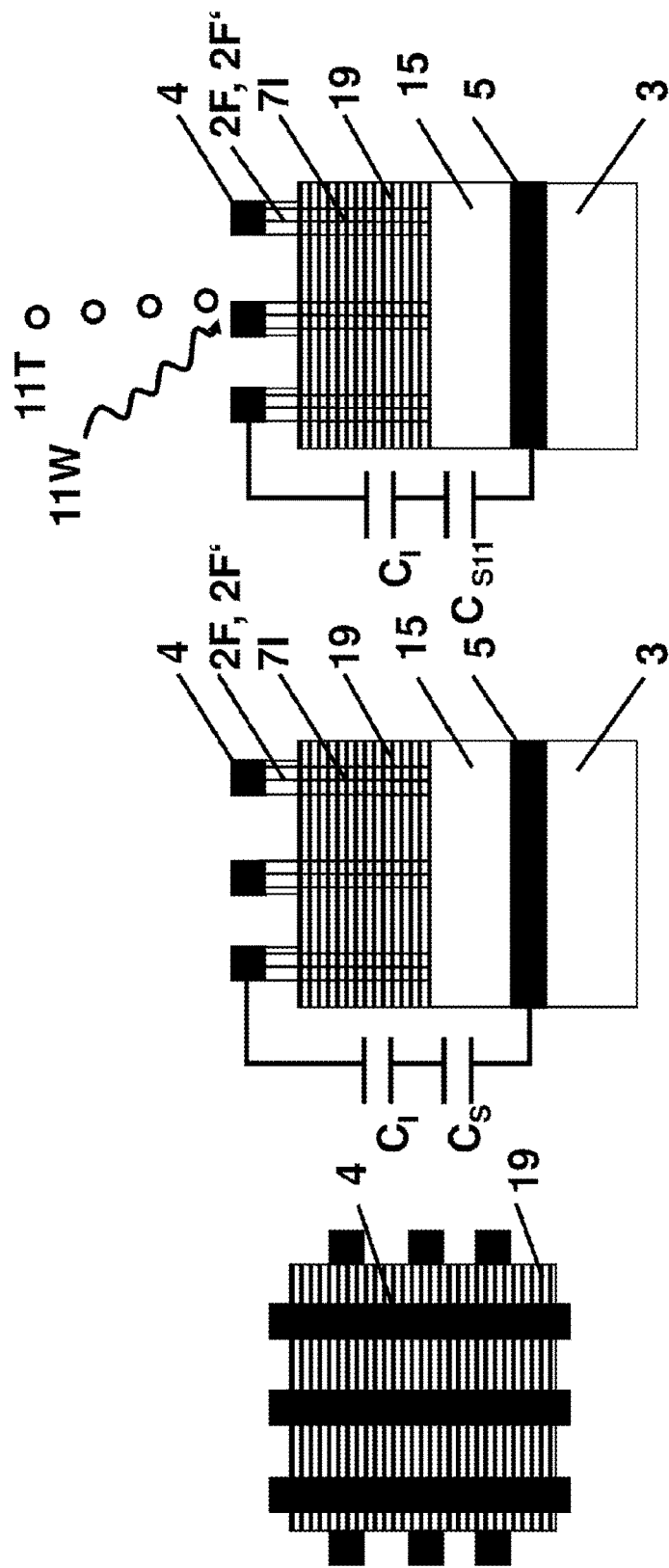

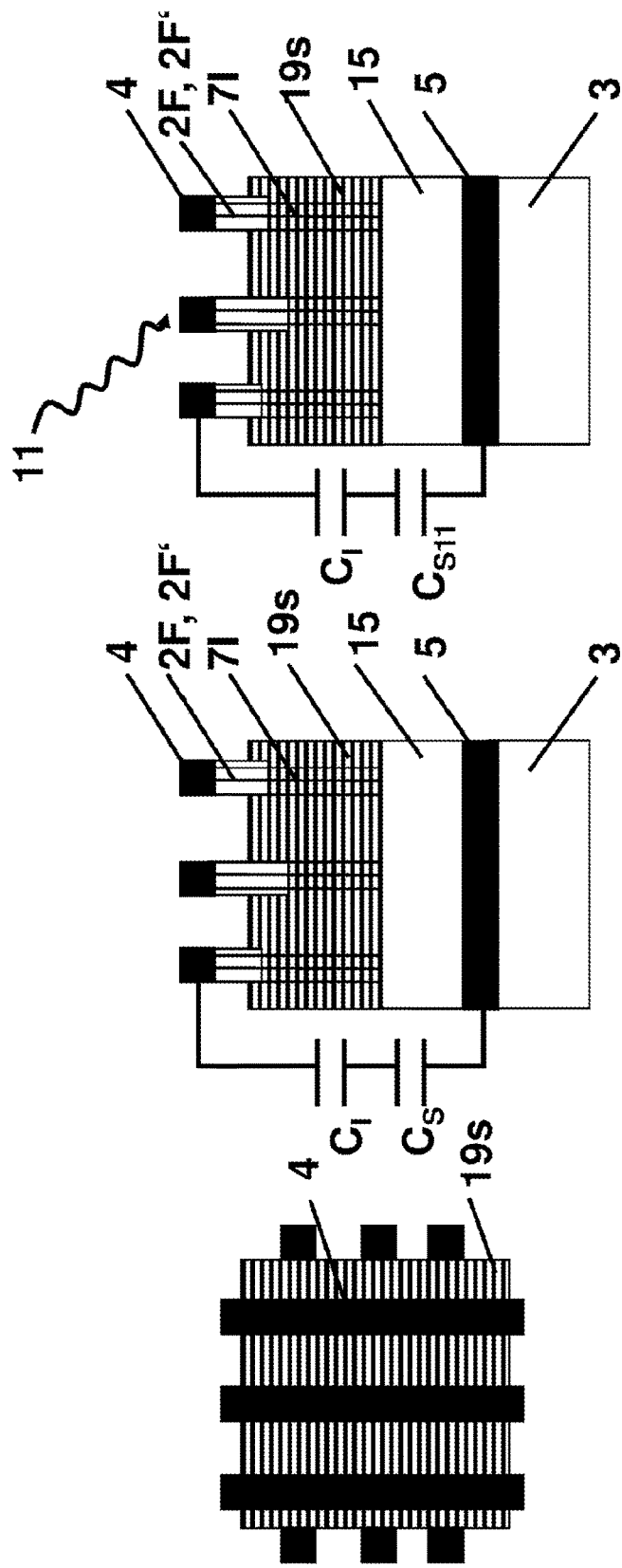

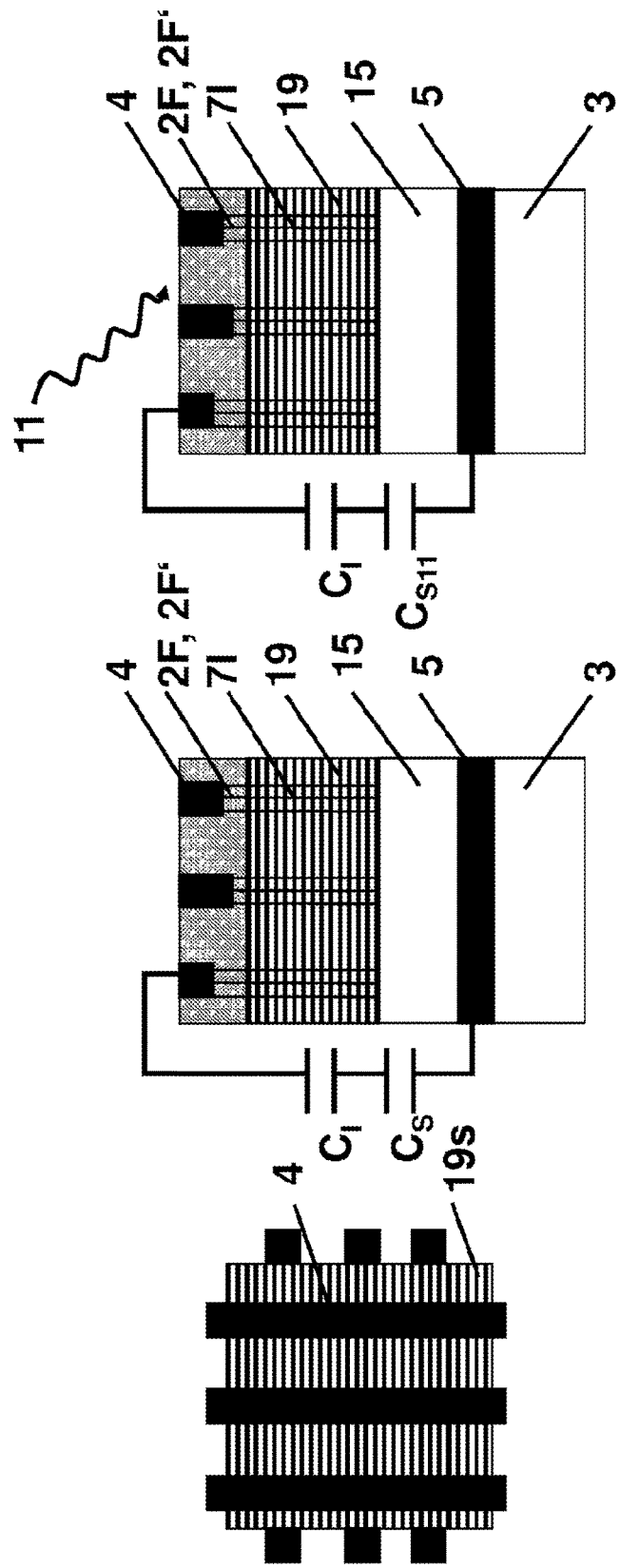

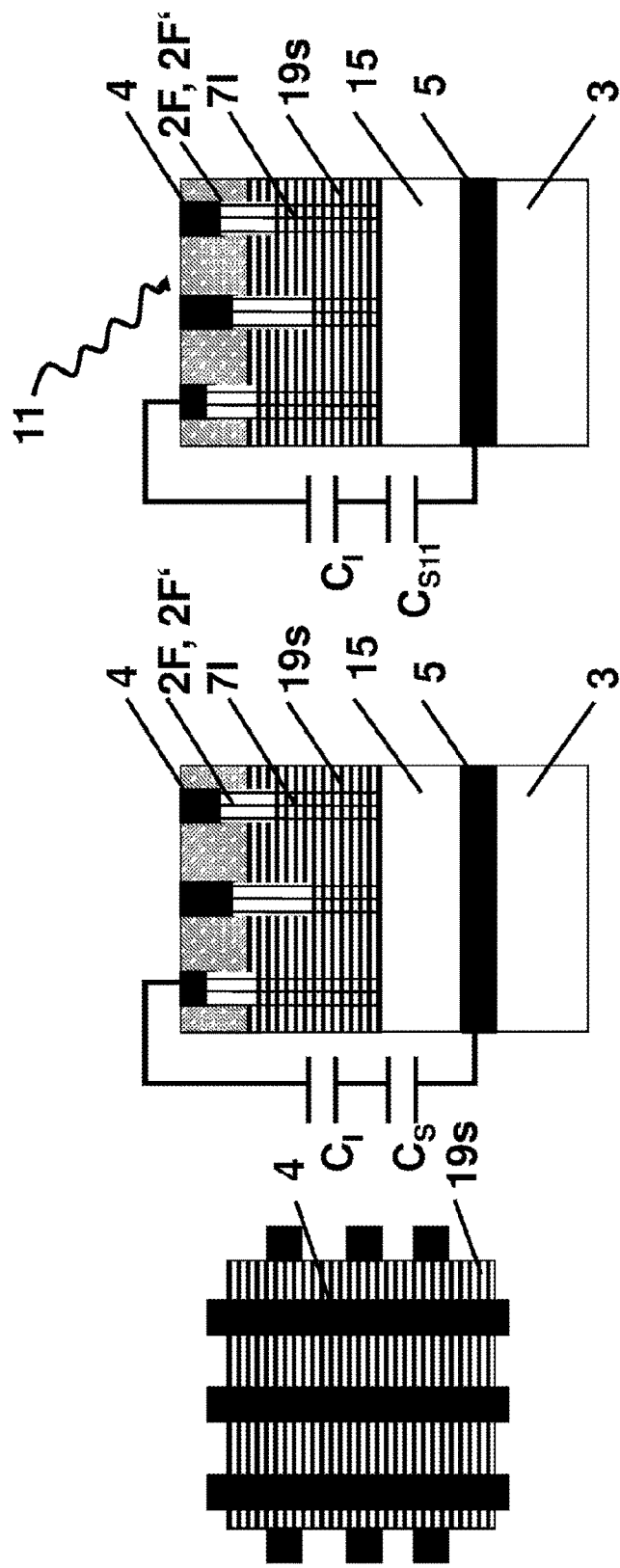

DETECTOR COMPRISING A VARIABLE CAPACITANCE DIODE

BACKGROUND OF THE INVENTION

Field of the Invention

The invention relates to a variable capacitance diode, a method for producing a variable capacitance diode, a storage device for storing information comprising at least one such variable capacitance diode and a detector for detecting radiation comprising at least one such variable capacitance diode, wherein the variable capacitance diode comprises a multilayer system.

Variable capacitance diodes enable a variation in the capacitance thereof by applying an electric voltage, wherein variable capacitance diodes can be set up e.g. by means of a multilayer system made of differently doped semiconductor materials.

In another example, multilayer systems consisting of an insulator and a doped semiconductor, e.g. $SiO_2$ on p-conducting silicon, with a metal contact on the insulator and a metal contact on the doped semiconductor, have a capacitance dependent on the dielectric properties of the insulator and the depletion region in the doped semiconductor at the boundary between the insulator and the doped semiconductor. This capacitance can be controlled by applying an external voltage to the metal contact at the insulator and to the metal contact at the doped semiconductor. Defects can form in the insulator, at the interface between the insulator and the doped semiconductor and in the doped semiconductor. On account of these defects, the capacitance of the multilayer system measured by an AC voltage with a test frequency $f_{ac}$ depends on the test frequency $f_{ac}$. When irradiating by means of light with an energy greater than the electronic bandgap $E_g$ of the doped semiconductor, the extent of the depletion region in the doped semiconductor is reduced and the capacitance of the multilayer system is increased.

Moreover, metal-insulator-semiconductor structures are used in charge coupled devices (CCDs) and solid-state image sensors. A charge accumulation in the doped semiconductor on account of photo-generated charge carriers in the case of irradiation with light is detected. As a result of the continuous redistribution of the defects in metal-insulator-semiconductor structures, the capacitance of the metal-insulator-semiconductor structures is not stable when irradiated and it cannot be used as a detection signal in CCDs and solid-state image sensors.

Field-effect transistors with a ferroelectric dielectric can be used as ferroelectric storage devices, wherein the source-drain current value serves as read-out value of the stored information. However, on account of leakage currents through the ferroelectric dielectric, the polarization state of the ferroelectric dielectric degrades, and therefore such a storage device is relatively volatile.

U.S. Pat. No. 5,524,092 A describes variable capacitance diodes as storage devices, wherein this covers variable capacitance diodes with two electrodes and a layer sequence, arranged therebetween, with a layer made out of a ferroelectric material, layers as an adhesive and barrier layer made of conductive metals or conductive silicon nitride, and a layer made of a doped semiconductor material.

Diode structures with the material sequence of metal, $SrBi_2Ta_2O_9$ as ferroelectric, $HfO_2$ as insulator, and semiconductor for different insulator thicknesses are characterized in "Capacitance-voltage and retention characteristics of $Pt/SrBi_2Ta_2O_9/HfO_2/Si$ structures with various buffer layer thickness" (Tang et al., Applied Physics Letters, volume 94, page 212907, 2009); here, it is determined that structures with thinner $HfO_2$ layers are better suited in respect of the retention.

U.S. Pat. No. 5,751,049 A describes infrared detectors with metal-insulator-semiconductor structures.

BRIEF SUMMARY OF THE INVENTION

The invention provides a variable capacitance diode with an uncomplicated setup, the capacitance characteristic of which is adjustable in a variable and non-volatile manner with little energy consumption. Moreover, a method for producing such a variable capacitance diode is provided. Moreover, a storage medium with an uncomplicated setup for storing information using such a variable capacitance diode as a storage element is provided, wherein the storage medium is writable and readable with little energy consumption and at a high speed. Finally, a detector for detecting particle or wave radiation using such a variable capacitance diode as a sensitive element is provided.

In accordance with a first aspect of the invention, provision is made of an electric component in the form of a variable capacitance diode, i.e. an electric component with a variably adjustable capacitance. The variable capacitance diode has a first electrode and a second electrode for electrically contacting the variable capacitance diode. Moreover, the variable capacitance diode has a layer arrangement arranged in contact-making fashion between the first electrode and the second electrode, wherein the layer arrangement has, in succession in the direction from the first electrode to the second electrode, a layer made of a ferroelectric material (also referred to as "ferroelectric layer") and an electrically insulating layer made of a dielectric material (also referred to as "dielectric layer" or "insulating layer"). The layer made of the dielectric material has electrically charged impurities (i.e., electrically charged impurities are situated in the layer made of the dielectric material). By way of example, the ferroelectric material can be a multiferroic material.

The dielectric layer is preferably arranged at the ferroelectric layer in directly contact-making fashion. By way of example, provision can be made for the layer arrangement to consist of the ferroelectric layer and the dielectric layer.

However, in accordance with one embodiment, the layer arrangement moreover has a layer made of a doped semiconductor material (also referred to as "semiconductor layer" or "semiconducting layer"). In accordance with this embodiment, the dielectric layer is arranged between the ferroelectric layer and the semiconducting layer such that the layer arrangement has, in succession in the direction from the first electrode to the second electrode, the layer made of the ferroelectric material, the layer made of the dielectric material and the layer made of the doped semiconductor material. In particular, provision can be made for the layer arrangement to consist of the ferroelectric layer, the dielectric layer and the semiconductor layer.

The layer arrangement is electrically contacted by means of the two electrodes, wherein the first electrode is arranged in contact-making fashion at the one edge layer of the layer arrangement and the second electrode is arranged in contact-making fashion at the other edge layer of the layer arrangement. Thus, depending on e.g. the configuration of the layer arrangement, provision can be made for the first electrode to be arranged in contact-making fashion at the ferroelectric layer and for the second electrode to be arranged at the dielectric layer (in the case where no semiconducting layer is present) or at the semiconducting layer (in the case where a semiconducting layer is present). The first electrode is also referred to as front electrode, top electrode or front contact. The second electrode is also referred to as counter electrode, bottom electrode, counter contact or bottom contact.

By applying an electric voltage between the two electrodes, it is possible to influence the direction of the spontaneous polarization of the ferroelectric material. If the electric field which is caused by the drop in the applied voltage across the ferroelectric layer is greater than the coercivity field strength of the ferroelectric material, there is a substantially complete alignment of the polarization in accordance with the direction of the electric field, wherein the polarization of the ferroelectric material can be reversed in terms of polarity by reversing the polarity of the applied voltage. Such voltages which suffice for exceeding the coercivity field strength of the ferroelectric layer are also referred to as switching or write voltages below.

It was found that the capacitance or capacitance characteristic of the variable capacitance diode varies in nonvolatile fashion with the magnitude (wherein however the magnitude of the switching voltage always suffices to exceed the coercivity field strength of the ferroelectric layer) and the polarity of such a switching voltage, i.e. it is permanently adjustable by means of a time-restricted or continuous application of such a switching voltage to a value or state dependent on the magnitude and the polarity of the switching voltage.

According to current knowledge, the polarization e.g. present in the ferroelectric layer can influence the electrically charged impurities in the neighboring dielectric layer, wherein these impurities are repositioned (e.g. aligned and/or displaced) in accordance with the charge (magnitude and sign) thereof with a corresponding change in the charge centroid. Hence, e.g. the charge centroid of the electrically charged impurities in the dielectric layer has a different position if the first polarization direction is present than if the second polarization direction is present, wherein this variation in the charge centroid is accompanied by a variation in the capacitance or capacitance characteristic of the variable capacitance diode (i.e. the variable capacitance diode has different capacitance-voltage characteristics when the two polarization directions of the ferroelectric layer are present). As an alternative or in addition thereto, the capacitance characteristic can be varied not only by varying the polarity of the applied voltage but also by varying the magnitude of the applied voltage.

Hence, the variable capacitance diode according to the invention can be put in nonvolatile fashion into different switching states with different capacitances or capacitance characteristics by a (temporary or permanent) application of different switching voltages, with these differing in terms of magnitude and/or polarity. However, in this case, the magnitude of such a switching voltage is always so large that it suffices to exceed the coercivity field strength of the ferroelectric layer (i.e. the magnitude of the switching voltage is so large that the electric field, which is caused by the voltage drop across the ferroelectric layer in the variable capacitance diode when applying the electrodes of same with the switching voltage, is greater than the coercivity field strength of the ferroelectric material).

In particular, the variable capacitance diode can be put into a first switching state by applying a first switching voltage and it can be put into a second switching state by applying a second switching voltage, wherein the magnitude of the first switching voltage and of the second switching voltage is at least so large that, in the layer made of the ferroelectric material, the coercivity field strength of the ferroelectric material is exceeded, and wherein the first switching voltage has a different magnitude and/or different polarity to the second switching voltage.

Accordingly, the variable capacitance diode according to the invention can, for example, be put into a first switching state by applying a first switching voltage with a first polarity and be put into a second switching state by applying a second switching voltage with a second polarity, wherein the second polarity is directed counter to the first polarity, and wherein the magnitude of the first switching state and of the second switching state is at least so large that, in the layer made of the ferroelectric material, the coercivity field strength of the ferroelectric material is exceeded. The first switching state and the second switching state are also referred to as first write voltage and second write voltage, respectively.

Here, a corresponding DC voltage pulse suffices to reverse the polarization of the ferroelectric material, i.e. there is no need for continuously applied voltage. After applying an external DC voltage to the two electrodes, the polarization state of the ferroelectric layer is stabilized as no leakage currents for removing the polarization charge can flow through the dielectric layer acting as an insulating layer.

If a semiconducting layer is present, the overall capacitance of the variable capacitance diode is moreover determined by the capacitance of the depletion region of the semiconducting layer, wherein this capacitance portion can be dependent, in particular, on radiation incident on the semiconducting material.

The capacitance characteristic of the variable capacitance diode varies with the switching state thereof, wherein e.g. the variable capacitance diode has a different capacitance-voltage characteristic (CV characteristic) in the first switching state, or proceeding therefrom, than in the second switching state, or proceeding therefrom. The capacitance C of the variable capacitance diode in the case of a DC voltage V can be detected as known per se by applying the DC voltage V to the two electrodes and superimposing onto the DC voltage V an AC voltage $V_{ac}$ with a small amplitude, wherein the CV characteristic is detected by driving through the applied DC voltage V.

In particular, the CV characteristic of the variable capacitance diode with an optional semiconducting layer has a minimum, wherein the position of this minimum varies with the switching state of the variable capacitance diode. For example, when a first switching state and a second switching state is predetermined, the CV characteristic has a minimum $M1=(U_{1,min}; C_{1,min})$ in the first switching state or proceeding therefrom, and it has a minimum $M2=(U_{2,min}; C_{2,min})$ in the second switching state or proceeding therefrom, where $U_{i,min}$ denotes the DC voltage value and $C_{i,min}$ denotes the capacitance value of the respective minimum (i=1, 2). Here, in terms of magnitude, the voltage values $U_{1,min}$ and $U_{2,min}$ are substantially smaller than the first switching voltage and the second switching voltage (i.e., the resultant voltage drop across the ferroelectric layer does not suffice to exceed the coercivity field strength at the voltages $U_{1,min}$ and $U_{2,min}$).

By virtue of it being possible to switch the variable capacitance diode to and fro between different switching states by varying the capacitance characteristic thereof by means of a DC voltage pulse, wherein no current flow is required for the switching as a result of the dielectric layer acting as an insulator, it is possible to set the capacitance of the variable capacitance diode with little energy consumption. By preventing leakage currents, which would lead to a removal of the polarization charge of the ferroelectric layer, by means of the dielectric layer, the set switching state is stable in time or non-volatile.

In accordance with one embodiment, the thickness of the dielectrict layer is at least 5 nm, preferably at least 50 nm. As a result of such a thickness of the dielectric layer, an electric current flow through same is reliably prevented. Moreover, such a sufficiently high thickness ensures that the displacement of the charge centroid (or the change in capacitance accompanying this) is reliably detectable by metrological means.

In the polarized state thereof (i.e. after applying the coercivity field strength), the ferroelectric layer has a material-dependent polarization surface charge density (i.e. polarization charge per unit surface) at the interface or edge surface thereof. The dielectric layer has a predetermined volume charge density (i.e. electrical charge per unit volume) of charged impurities.

In accordance with one embodiment, the materials and thicknesses of the ferroelectric layer and of the dielectric layer are selected in such a way that the magnitude of the product of the volume charge density and the thickness of the dielectric layer at most equals the magnitude of the polarization surface charge density of the ferroelectric layer. This enables a particularly pronounced variation of the charge centroid in the dielectric layer in a manner dependent on the polarization state of the ferroelectric layer.

In particular, provision can be made for the thicknesses (and materials) of the ferroelectric layer and of the dielectric layer to be matched to the first switching voltage and second switching voltage in such a way that the ferroelectric layer has a first or second polarization surface charge density after application of the first or second switching voltage to the interface thereof (wherein these two surface charge densities may be identical), and wherein the thickness of the dielectric layer is set in such a way that the product of the volume charge density and the thickness of the dielectric layer is, in terms of magnitude, at most equal to the smaller one of the two values of the first polarization surface charge density and the second polarization surface charge density.

By way of example, silicon (Si), germanium (Ge), gallium arsenide (GaAs), gallium nitride (GaN), gallium phosphide (GaP), silicon carbide (SiC), zinc telluride (ZnTe) and zinc oxide (ZnO) can be used as semiconductor materials with an electronic bandgap in the IR-VIS-UV spectral range. At room temperature, the electronic bandgap is 1.10 eV for silicon, 0.75 eV for germanium, 1.43 eV for gallium arsenide, 3.37 eV for gallium nitride, 2.26 eV for gallium phosphide, 2.39-2.33 eV for silicon carbide, 2.40 eV for zinc telluride and 3.37 eV for zinc oxide.

By way of example, low-k insulators with a static relative permittivity less than the static relative permittivity of silicon dioxide ($SiO_2$) can be used as dielectric material (which is also referred to as insulator in the present case). By way of example, low-k insulators include hydrogen silsesquioxane, polyimides and silica gels. The static relative permittivity is 2.9-3.1 for hydrogen silsesquioxane, 3.1-3.4 for polyimides and 2.0-2.5 for silica gels.

Provision can also be made for using e.g. silicon dioxide ($SiO_2$), silicon nitride ($Si_3N_4$), silicon oxynitride ($SiO_xN_y$) and aluminum oxide ($Al_2O_3$) or combinations thereof as dielectric or insulators with moderate static relative permittivities. The static relative permittivity is 3.8 for silicon dioxide, 5.5-9.4 for silicon nitride, 3.9-7.0 for silicon oxynitride and 7.6-8.6 for aluminum oxide.

By way of example, hafnium oxide ($HfO_2$), tantalum oxide ($Ta_2O_5$) and titanium dioxide ($TiO_2$) or combinations thereof can be provided as further insulators with a moderate static relative permittivity. The static relative permittivity is 25 for hafnium oxide, 24-28 for tantalum oxide and 50-100 for titanium dioxide.

By way of example, bismuth iron oxide ($BiFeO_3$), yttrium manganese oxide ($YMnO_3$) and/or bismuth manganese oxide ($BiMnO_3$) can be provided as ferroelectric materials. Ferroelectric materials become piezoelectric above the ferroelectric Curie temperature and lose the polarization state thereof. The ferroelectric Curie temperature (polarization charge) is 1100 K (90-95 $\mu C/cm^2$) in the case of $BiFeO_3$, 913 K-1270 K (12 $\mu C/cm^2$) in the case of $YMnO_3$ and 105 K (9 $\mu C/cm^2$) in the case of $BiMnO_3$.

In accordance with a further aspect of the invention, different switching states of the variable capacitance diode act as different storage states. Thus, for example, a first switching state and a second switching state can act as binary storage states. Accordingly, a storage device or storage medium is provided for storing information, wherein the storage device has as storage elements one or more variable capacitance diodes in accordance with the embodiments described above.

In particular, the storage device can be embodied in such a way that different write voltages can be applied thereby between the first electrode and the second electrode, wherein the different write voltages differ in terms of magnitude and/or polarity, and so the variable capacitance diode can be put into the associated different storage states by applying the different write voltages. Here, the magnitude of each of the write voltages is at least so large that, in the layer made of the ferroelectric material, the coercivity field strength of the ferroelectric material is exceeded.

Accordingly, the storage device can be embodied in such a way that it can apply at least one first write voltage and a second write voltage between the first electrode and the second electrode, wherein the magnitude of the first write voltage and the second write voltage is at least so large that, in the layer made of the ferroelectric material, the coercivity field strength of the ferroelectric material is exceeded, and wherein the first write voltage has a different magnitude and/or a different polarity from the second write voltage such that the variable capacitance diode can be put into a first switching state acting as first storage state with a first capacitance characteristic by applying the first write voltage and it can be put into a second switching state acting as a second storage state with a second capacitance characteristic by applying the second write voltage.

Preferably, the polarity of the first write voltage is directed counter to the polarity of the second write voltage such that the variable capacitance diode has opposite polarizations of the ferroelectric layer in the two resultant storage states.

However, provision can also be made for the storage device to be embodied in such a way that a plurality of different storage states are realized by write voltages with the same polarity but different voltage magnitudes. In particular, provision can be made for the first write voltage and the second write voltage to have the same polarity and different voltage magnitudes.

Moreover, it is also possible to provide more than two different write voltages such that the variable capacitance diode can be put into more than two storage states by means of the storage device and it can therefore act as multi-capacitive storage element.

Furthermore, the storage device can be embodied in such a way that it can detect or read out the storage state of the variable capacitance diode without current by detecting the capacitance of the variable capacitance diode.

By way of example, the capacitance-voltage characteristic of the variable capacitance diode—as described above—has a minimum at a first minimum DC voltage $U_{1,min}$ in the first switching state or storage state and a minimum at a second minimum DC voltage $U_{2,min}$ in the second switching or storage state, wherein the storage device can be embodied to detect the capacitance of the variable capacitance diode at the first or second minimum DC voltage. By virtue of the readout of the current storage state occurring at $U_{1,min}$ or $U_{2,min}$, the energy consumption required for the readout can be kept low, wherein it is moreover ensured that the switching state of the variable capacitance diode is not influenced by the readout (since the electric field in the ferroelectric layer at the read-out voltages $U_{1,min}$ and $U_{2,min}$, respectively, is substantially less than the coercivity field strength).

The storage device can have e.g. a control unit for writing and/or reading the variable capacitance diode by means of the mechanisms explained above. By way of example, the control unit can be embodied to write the variable capacitance diode by applying the first or second write voltage to the electrodes of the variable capacitance diode such that the variable capacitance diode can be put into the first or second switching state in a defined manner by means of the control unit.

Moreover, the control unit can be embodied to read (the switching or storage state) of the variable capacitance diode by detecting the capacitance characteristic or the capacitance of the diode and assigning the detected capacitance to the respective switching state. Here, the capacitance is preferably detected at $U_{1,min}$ or $U_{2,min}$ as a read-out voltage, i.e. by applying a DC voltage with the value $U_{1,min}$ or $U_{2,min}$ to the two electrodes and superimposing an AC voltage $V_{ac}$ with a low amplitude onto this DC voltage (wherein the amplitude of the AC voltage is so small, in particular, that the overall amplitude resulting from the applied DC voltage and AC voltage does not suffice to exceed the coercivity field strength of the ferroelectric).

The capacitance characteristic of the variable capacitance diode can be influenced by radiation incident thereon such that conclusions about the radiation can be drawn by detecting the capacitance characteristic present.

Accordingly, a detector for detecting radiation is provided according to a further aspect of the invention, said detector having one or more variable capacitance diodes in accordance with the embodiments explained above as detector elements or as measurement variable recorders. Here, the radiation can be provided by particle radiation or electromagnetic radiation.

The detector can be embodied in such a way (e.g. by means of an appropriately embodied control unit) that it can apply a switching voltage between the first electrode and the second electrode, wherein the magnitude of the switching voltage is at least so large that, in the layer made of the ferroelectric material, the coercivity field strength of the ferroelectric material is exceeded when the switching voltage is applied to both electrodes, and so the variable capacitance diode can be put into a predetermined switching state with a defined capacitance characteristic by applying the switching voltage.

The detector can be embodied to detect the capacitance or capacitance characteristic of the variable capacitance diode and to characterize the radiation on the basis of the detected capacitance or capacitance characteristic. The present capacitance characteristic of the diode can be detected in a manner analogous to the procedure described above. By way of example, the characterization can be carried out by means of a comparison between the detected capacitance characteristic and one or more reference characteristics stored as references.

Thus, it was e.g. determined that the position of the minima $M1=(U_{1,min}; C_{1,min})$ and $M2=(U_{2,min}; C_{2,min})$ of the CV characteristic of the variable capacitance diode varies with the wavelength and intensity of electromagnetic radiation incident on the variable capacitance diode. Moreover, the position of the minima $M1=(U_{1,min}; C_{1,min})$ and $M2=(U_{2,min}; C_{2,min})$ of the CV characteristic of the variable capacitance diode varies with the type, energy and number of particles incident on the variable capacitance diode. Hence, the detector can be embodied in such a way (e.g. by means of the control unit) that it characterizes the wave or particle radiation incident on the variable capacitance diode on the basis of the detected capacitance characteristic, in particular on the basis of the position of the minimum of the CV characteristic of the variable capacitance diode. In particular, provision can be made for the detector or the control unit to be embodied such a way that it detects the position of the minimum of the CV characteristic of the variable capacitance diode and that the wavelength and/or the intensity of electromagnetic radiation incident on the variable capacitance diode is detected on the basis of the detected position of the minimum.

As a further example, the voltage value $U_{1,min}$ or $U_{2,min}$ of the minimum of the capacitance-voltage characteristic is constant for a predetermined wavelength $\square$ of the electromagnetic radiation, with, however, the capacitance value ($C_{1,min}$ or $C_{2,min}$) of the respective minimum shifting to larger values with increasing radiation intensity. Hence, the radiation intensity can be detected for a predetermined wavelength by detecting the capacitance value of the minimum of the CV characteristic. In this respect, provision can be made, for example, of disposing a spectral filter upstream of the variable capacitance diode in order to filter out the predetermined wavelength.

Hence, there is only a capacitive, current-free measurement when using the variable capacitance diode both as a storage element and as a detection element, enabling a substantially lower energy consumption and substantially shorter access times in relation to a current measurement and reducing the cooling power required for operation.

The storage device and the detector can have a plurality of variable capacitance diodes according to the invention in a crossbar array. Crossed conductor tracks (crossbar arrays) constitute a novel component architecture in semiconductor technology and they can be used as structured, electrically conductive contacts at the top side and at the bottom side of the functional layers. In a crossbar array, the structured or whole-area functional layer is embedded between the crossed conductor tracks. If the capacitance of a cell should be read, a read-out voltage with a test frequency $f_{ac}$ is applied to both conductor tracks, at the crossing point of which the cell lies.

In accordance with a further aspect of the invention, provision is moreover made of a method for producing a variable capacitance diode in accordance with one of the embodiments explained above. In accordance with the method, the ferroelectric material is initially applied in the amorphous phase to the dielectric layer at room temperature (e.g. by means of magnetron sputtering or by means of pulsed laser plasma deposition) and subsequently recrystallized by means of an optical energy influx (e.g. by means of flash lamps or lasers). As a result, the heat influx into the dielectric and, optionally, into the semiconductor material can be kept low and damage of same can be avoided.

Provision can be made of structuring the dielectric layer prior to applying the ferroelectric material such that, when applying the ferroelectric material, same is likewise structured accordingly. Provision can moreover be made of increasing the number of charged impurities in the dielectric layer prior to the application of the ferroelectric material, for example at the crossing points of a crossbar array structure, by means of ion implantation such that the capacitance-voltage characteristic of the various crossing points is likewise correspondingly different.

Therefore, a variable capacitance diode according to the invention can have e.g. a multilayer system in the form of an electrode-ferroelectric-dielectric-electrode structure, wherein the variable capacitance diode has a non-volatile and irradiation-sensitive capacitance. Moreover, a semiconductor material is preferably arranged between the dielectric and the second electrode such that, below, the structure is only explained in more detail with the presence of the semiconducting layer. The dielectric layer or insulating layer is embodied, in particular, as a thick insulating layer with a large number of electrically charged impurities in the insulator; the ferroelectric layer between electrode and insulator serves for the spatial stabilization and positioning of the charged impurities in the insulator.

The polarization state of the ferroelectric layer is stabilized after applying an external voltage to the electrode-ferroelectric-insulator-semiconductor-electrode structure since no leakage currents can flow through the thick insulating layer to remove the polarization charge. The CV characteristics of the electrode-ferroelectric-insulator-semiconductor-electrode structure are quantifiable without and with irradiation since the charge centroid of the charged impurities in the insulator is stabilized in a manner dependent on the polarization state of the ferroelectric layer.

The switching or write voltage polarizes the ferroelectric layer, and varies and stabilizes the charge centroid in the insulator. The information is read by applying a read-out voltage from the region of the flat cable region of the variable capacitance diode by measuring the capacitance. The storage state, i.e. the polarization state of the ferroelectric layer and, as a result thereof, the position of the stabilized charge centroid as well, are not changed by measuring the capacitance at the read-out voltage.

The arrangement can be used as a capacitive storage medium for storing binary information and as a capacitive radiation detector. The arrangement can be used, for example when using at least one electrode transparent to electromagnetic waves and/or particles, as a detector for electromagnetic waves and/or particles when irradiated by the latter. Electromagnetic waves incident on the arrangement predominantly change the occupancy of the impurities in the insulator and the occupancy of the doping atoms in the semiconductor. Particles incident on the arrangement can change the polarization state of the ferroelectric layer, the concentration and/or the distribution of the impurities in the insulating layer and the doping of the semiconductor. By way of example, non-volatile photo-capacitive sensors, photodetectors and CCD/CMOS sensors, ferroelectric storage devices and particle detectors can be provided as an application.

By way of example, (a) the use of a nonvolatile capacitance as a direct read-out parameter instead of a charge or a current (as a result of which, for example, a faster read-out by a factor of approximately 1000 and an energy consumption lower by a factor of approximately 1000 are possible), (b) the wavelength and intensity dependence of the read-out parameter, and hence a higher sensitivity and lower noise compared to the current necessity of using color filters, (c) the option for simultaneous, independent read-out of the capacitance at each individual detector cell instead of a serial, line-by-line read-out, and hence an increase in the read-out speed, and (d) a simple production of the ferroelectric layer by depositing amorphous ferroelectric material (e.g. $BiFeO_3$) and subsequent recrystallization (e.g. by means of flash lamp annealing) emerge as advantages of the explained technology in relation to e.g. conventional CCD sensors.

BRIEF DESCRIPTION OF THE SEVERAL VIEWS OF THE DRAWING

Below, the invention is elucidated on the basis of exemplary embodiments, with reference being made to the attached figures, with equivalent or similar features being provided with the same reference sign; here, schematically:

FIGS. 1a, 1b: show the setup and state of a multilayer system with nonvolatile and irradiation-sensitive capacitance when applying a voltage V1, the magnitude of which does not suffice to exceed the coercivity field strength;

FIGS. 3a, 3b: show the setup and state of the multilayer system after applying a voltage −V2, the magnitude of which suffices to exceed the coercivity field strength;

FIGS. 4a, 4b1, 4b2, 4c: show the setup and state of the multilayer system after applying a voltage +V2, +V2$_j$, −V2, −V2$_j$, and the respectively associated capacitance-voltage characteristic;

FIGS. 5a, 5b1, 5b2, 5c: show the stability of the capacitance of the multilayer system at the voltage points with the capacitance minima M1 and M2;

FIGS. 7a, 7b1, 7b2, 7c: show the stability of the capacitance of the multilayer system at the voltage points with the capacitance minima M1 and M2 in the case of irradiation by a monochromatic electromagnetic wave;

FIGS. 8a, 8b, 8c: show the setup and state of the multilayer system when applying a voltage +V2 and −V2 in the case of irradiation by particles, and possible structuring of an electrode, transparent to particles, at the front side of the multilayer system;

FIGS. 9a, 9b, 9c: show a multilayer system with a crossbar array structure and a possibility for structuring the employed contacts and the ferroelectric material;

FIGS. 10a, 10b, 10c: show a further multilayer system with a crossbar array structure and the possibility of structuring the employed contacts and the ferroelectric material and the insulator;

FIGS. 11a, 11b, 11c: show a further multilayer system with a crossbar array structure and the possibility of structuring the employed contacts and the ferroelectric material; and FIGS. 12a, 12b, 12c: show a further multilayer system with a crossbar array structure and a possibility of structuring the employed contacts and the ferroelectric material and the insulator.

DESCRIPTION OF THE INVENTION

Figure 2A:
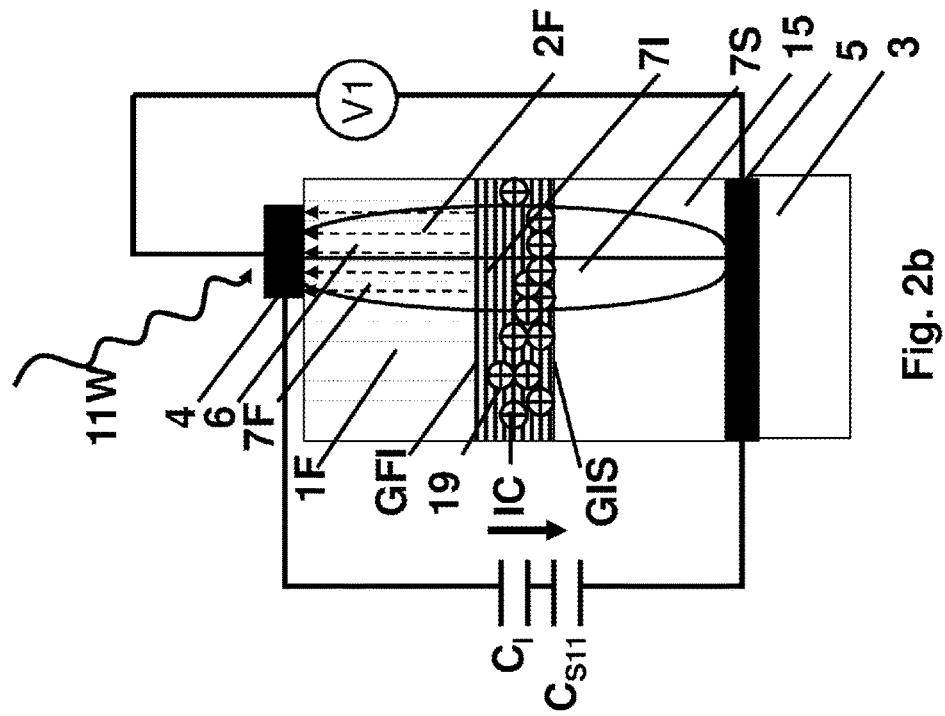
FIGS. 2a, 2b: show the setup and state of the multilayer system after applying a voltage +V2, the magnitude of which suffices to exceed the coercivity field strength.

FIGS. 1a and 1b show the basic design of a multilayer system or a variable capacitance diode 1 in the form of the multilayer system in accordance with one embodiment. The variable capacitance diode 1 has a layer arrangement with a layer 1F made of a ferroelectric material (here e.g. BiFeO₃), an electrically insulating layer 19 made of a dielectric material (here e.g. SiN) and a layer 15 made of a doped semiconductor material (here e.g. p-Si). The dielectric layer 19 has charged impurities IC (here e.g. positively charged impurities in the form of foreign atoms, which were introduced into the SiN layer during the application of the BiFeO₃ layer).

Moreover, the variable capacitance diode 1 has a first electrode 4 and a second electrode 5, wherein the first electrode 4 is applied in contact-making fashion at the ferroelectric layer 1F and the second electrode 5 is applied in contact-making fashion at the doped semiconductor layer 15 such that variable capacitance diode 1 has, in succession in the direction from the first electrode 4 to the second electrode 5, the ferroelectric layer 1F, the dielectric layer or insulating layer 19 and the doped semiconductor layer 15.

The overall capacitance of the multilayer system is composed of the nonvolatile capacitance $C_I$ of the insulating layer 19 and the nonvolatile and irradiation-dependent capacitance $C_S$, $C_{S11}$ of the depletion region of the doped semiconductor 15 (where $C_S$ denotes the capacitance of the depletion region without incident radiation 11 and $C_{S11}$ denotes the capacitance of the depletion region in the case of incident radiation 11). In the figures, the capacitances $C_I$, $C_S$, $C_{S11}$ are visualized as an equivalent circuit diagram.

When applying a voltage V1 to the front contact 4 and the associated counter contact 5, there predominantly is a change in the capacitance $C_S$, $C_{S11}$ of the depletion region of the doped semiconductor 15. The multilayer system can be applied to a substrate 3.

Ferroelectric substances are always also piezoelectric. Without an externally applied voltage V1, an electric polarization forms spontaneously (not spontaneously) in the ferroelectric (piezoelectric) material 1F, but said electric polarization varies locally. In the region 2F, the ferroelectric layer 1F is contacted by the front contact 4. With an externally applied voltage V1, an electric polarization forms spontaneously (not spontaneously) in the region 2F of the ferroelectric (piezoelectric) material 1F (elucidated in the figures by the arrows, depicted using dashed lines, in the region 2F of the ferroelectric layer 1F). On account of the electric polarization in the region 2F of the ferroelectric material 1F, electric field lines 7F form in the multilayer system in the region of the ferroelectric (piezoelectric) material 2F, electric field lines 7I form in the region of the insulator 19 and electric field lines 7S form in the region of the doped semiconductor 15.

When the electric field which is caused by the drop in the applied voltage V1 across the region 2F of the ferroelectric layer is less than the coercivity field strength of the ferroelectric material, the ferroelectric material 1F is not electrically polarized in a homogeneous fashion in the region 2F either and the electric field lines 7F are not directed. In this case, the electric field 7F in the ferroelectric region 2F has no influence on the distribution of the charges IC in the insulator 19. The distribution of the charges IC in the insulator 19 is stabilized in the case of sufficiently large electric polarization charges of the ferroelectric material 1F, but the charge centroid of the charges IC in the insulator 19 is displaced neither in the direction of the interface GFI between the ferroelectric layer 1F and the insulating layer 19 nor in the direction of the interface GIS between the insulating layer 19 and the doped semiconductor material 15.

FIG. 1a elucidates the case without irradiation; FIG. 1b elucidates the case where the variable capacitance diode 1 is irradiated by electromagnetic waves 11W. When irradiating the multilayer system with electromagnetic waves 11W with an energy that is greater than the electronic bandgap of the doped semiconductor 15, the capacitance of the doped semiconductor 15 changes from $C_S$ to $C_{S11}$.

FIG. 2a shows the multilayer system when applying a positive voltage +V2 to the front contact 4, wherein (by an appropriate adjustment of the magnitude of the voltage) the electric field which is caused by the drop of the applied voltage +V2 across the region 2F of the ferroelectric layer 1F is greater than the coercivity field strength of the ferroelectric material such that the ferroelectric material 1F is electrically polarized in a homogeneoius fashion in the region 2F and the electric field lines 7F all point in the same direction. In this case, the electric field 7F in the region 2F of the ferroelectric material 1F influences the distribution of the charges IC in the insulator 19. As an example, in the present case in accordance with FIG. 2a, the positive charges IC are displaced in the direction of the interface GIS between the insulating layer 19 and the doped semiconductor material 15 by applying the voltage +V2 with the positive terminal at the first electrode 4 and the negative terminal at the second electrode 5, accompanied by a corresponding displacement of the associated charge centroid. The displacement of the charge centroid of the charged impurities in the dielectric layer 19 is elucidated in the figures by the arrow depicted to the left next to the dielectric layer 19. The positioning of the charged impurities IC in the insulator 19 is stabilized in the case of a sufficiently large electric polarization charge of the ferroelectric material 1F. The positioning of the charged impurities IC in the insulator 19 remains stabilized for as long as an externally applied voltage V1 does not change the electric polarization in the region 2F of the ferroelectric material 1F.

Figure 2B:
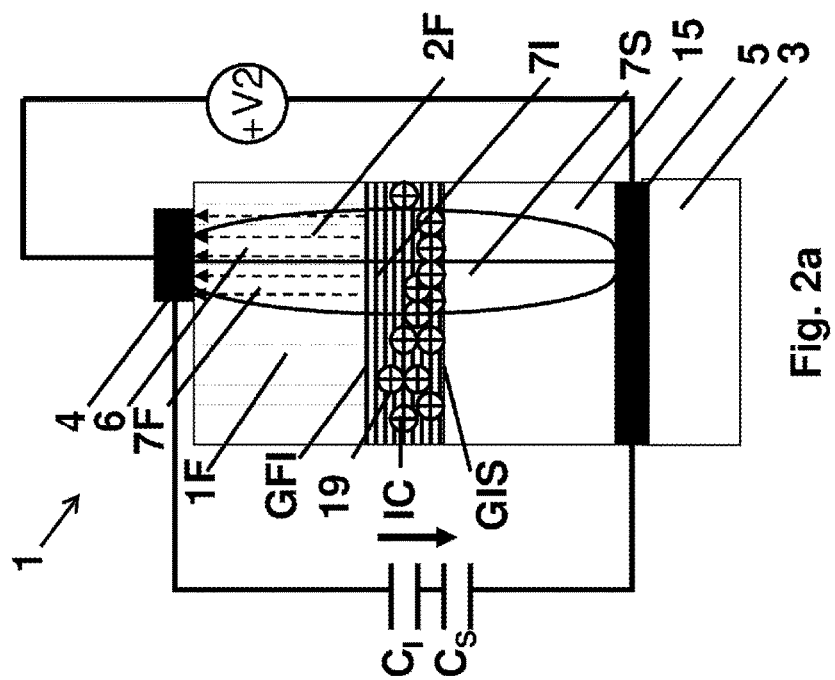

FIG. 2b elucidates that the charge centroid of the charged impurities IC is displaced in the direction of the interface GIS after applying a voltage +V2, even when irradiating the multilayer system with electromagnetic waves 11W with an energy which is greater than the electronic bandgap of the doped semiconductor 15, and that the capacitance of the doped semiconductor 15 changes from $C_S$ to $C_{S11}$.

FIG. 3a shows the multilayer system when applying a negative voltage −V2 to the front contact 4, wherein the electric field which is caused by the drop of the applied voltage −V2 across the region 2F is greater than the coercivity field strength of the ferroelectric material such that the ferroelectric material 1F is electrically polarized in a homogeneous fashion in the region 2F and the electric field lines 7F all point in the same direction. In this case, the electric field 7F in the region 2F of the ferroelectric material 1F influences the positioning of the charged impurities IC in the insulator 19. As an example, in the present case in accordance with FIG. 3a, the positive charges IC are displaced in the direction of the interface GFI between the ferroelectric layer 1F and the insulating layer 19 by applying the voltage −V2 with the negative terminal at the first electrode 4 and the positive terminal at the second electrode 5. The distribution of the charges IC in the insulator 19 is stabilized in the case of sufficiently large electric polarization charges of the ferroelectric material 1F. The distribution of the charges IC in the insulator 19 remains stabilized for as long as an externally applied voltage V1 does not change the electric polarization in the region 2F of the ferroelectric material 1F.

FIG. 3b elucidates that the capacitance of the doped semiconductor 15 changes from $C_S$ to $C_{S11}$ after applying a voltage −V2, even when irradiating the multilayer system, which has charges IC displaced in the direction of the interface GFI, with electromagnetic waves 11W with an energy which is greater than the electronic bandgap of the doped semiconductor 15.

FIG. 4b1 shows two distinguishable capacitance-voltage (CV) characteristics of the multilayer system without irradiation in a manner dependent on the start point of the externally applied voltage V. In order to detect the capacitance C at a voltage V, the DC voltage V is applied to the electrodes of the multilayer system and superimposed by an AC voltage $V_{ac}$; the capacitance is established in a manner known per se from the response of the system.

If a negative voltage −V2 is initially applied between the front side contact 4 and the rear side contact 5 (FIG. 3a and FIG. 4a), e.g. positive charges IC are displaced in the direction of the interface GFI between the insulating layer 19 and the region 1F and/or region 2F and the flatband voltage is less than in the case of uniformly distributed charges IC in the insulator 19. The corresponding CV curve has a minimum $M1=(U_{1,min}; C_{1,min})$.

If a positive voltage +V2 is initially applied between the front side contact 4 and the rear side contact 5 (FIG. 2a and FIG. 4c), e.g. positive charges IC are displaced in the direction of the interface GIS between the insulating layer 19 and the doped semiconductor material 15 and the flatband voltage is greater than in the case of uniformly distributed charges IC in the insulator 19. The corresponding CV curve has a minimum $M2=(U_{2,min}; C_{2,min})$.

The difference in the flatband voltages for the two possible extremal distributions of the charges IC in the insulator 19 is greater, the greater the electric polarization charge of the ferroelectric material, the greater the concentration of the charges IC in the insulator 19 and the thicker the insulator 19 are. In the present case, the thickness of the insulating layer 19 is 50 nm as an example, as result of which a reliable electrical insulation and a reliably detectable geometric displacement of the charge centroid of the charged impurities IC are ensured. Moreover, the thicknesses of the ferroelectric layer 1F and of the dielectric layer 19 are selected in such a way that the product of the volume charge density of the charged impurities IC and the thickness of the dielectric layer 19, in terms of magnitude, at most equals the polarization surface charge density of the ferroelectric layer 1F in the polarized state, as a result of which a pronounced variation of the charge centroid of the charged impurities IC in the dielectric layer 19 depending on the polarization state of the ferroelectric layer 1F is made possible.

FIG. 4b2 shows the CV characteristics of the variable capacitance diode 1 for a plurality of different switching voltages $-V2_j$ (with j=1, 2, 3, 4)—which have the same polarity but different voltage magnitudes—together with a CV characteristic for a switching voltage +V2 with an opposite polarity in relation to the switching voltages $-V2_j$. From the figure, it is possible to identify that the CV characteristics for the switching voltages $-V2_j$ have minima $M1_j$ which are clearly distinguishable from one another, whereas the CV characteristic for the switching voltage +V2 has a minimum M2.

FIGS. 5a to 5c show how the two possible extremal distributions of the charges IC in the insulator 19 are set by a single application of a voltage pulse with an amplitude −V2 (FIG. 5a) or +V2 (FIG. 5c), in which the coercivity field strength in the ferroelectric layer 1F is exceeded. Below, such a voltage pulse is referred to as switching or write voltage $U_{write}$. FIG. 5b1 shows that the capacitance of the multilayer system is not changed when applying a DC voltage with a small value $U_{1,min}$ or $U_{2,min}$, at which the CV curve has the minimum M1 or the minimum M2.

By way of example, if the write voltage pulse −V2 is applied, the CV curve of the multilayer system has the minimum M1 and the capacitance read with a read-out voltage $U_{read}=U_{1,min}$ of the minimum M1 is less than the capacitance read out with a read-out voltage $U_{read}=U_{2,min}$ of the minimum M2. By contrast, if the write voltage pulse +V2 is applied, the CV curve of the multilayer system has a minimum M2 and the capacitance read with a read-out voltage $U_{read}=U_{2,min}$ of the minimum M2 is less than the capacitance read out with a read-out voltage $U_{read}=U_{1,min}$ of the minimum M1. FIG. 5b2 shows that the two possible extremal distributions of the charges IC in the insulator 19 are set in nonvolatile fashion and not changed by applying the read-out voltage on a timescale greater than 300 minutes.

Therefore, the variable capacitance diode 1 can be put into a stable first switching state by applying the first switching voltage −V2 and it can be put into a stable second switching state by applying the second switching voltage +V2, wherein these two switching states have different capacitance characteristics. The switching voltages are also referred to as write voltages.

Accordingly, the variable capacitance diode 1 can act e.g. as a storage element for storing binary information, wherein the first switching state and the second switching state act as first storage state and second storage state and wherein a read-out of the storage state can take place by detecting the capacitance of the variable capacitance diode at the voltage $U_{1,min}$ or $U_{2,min}$.

Figures 6A, 6B, 6C:
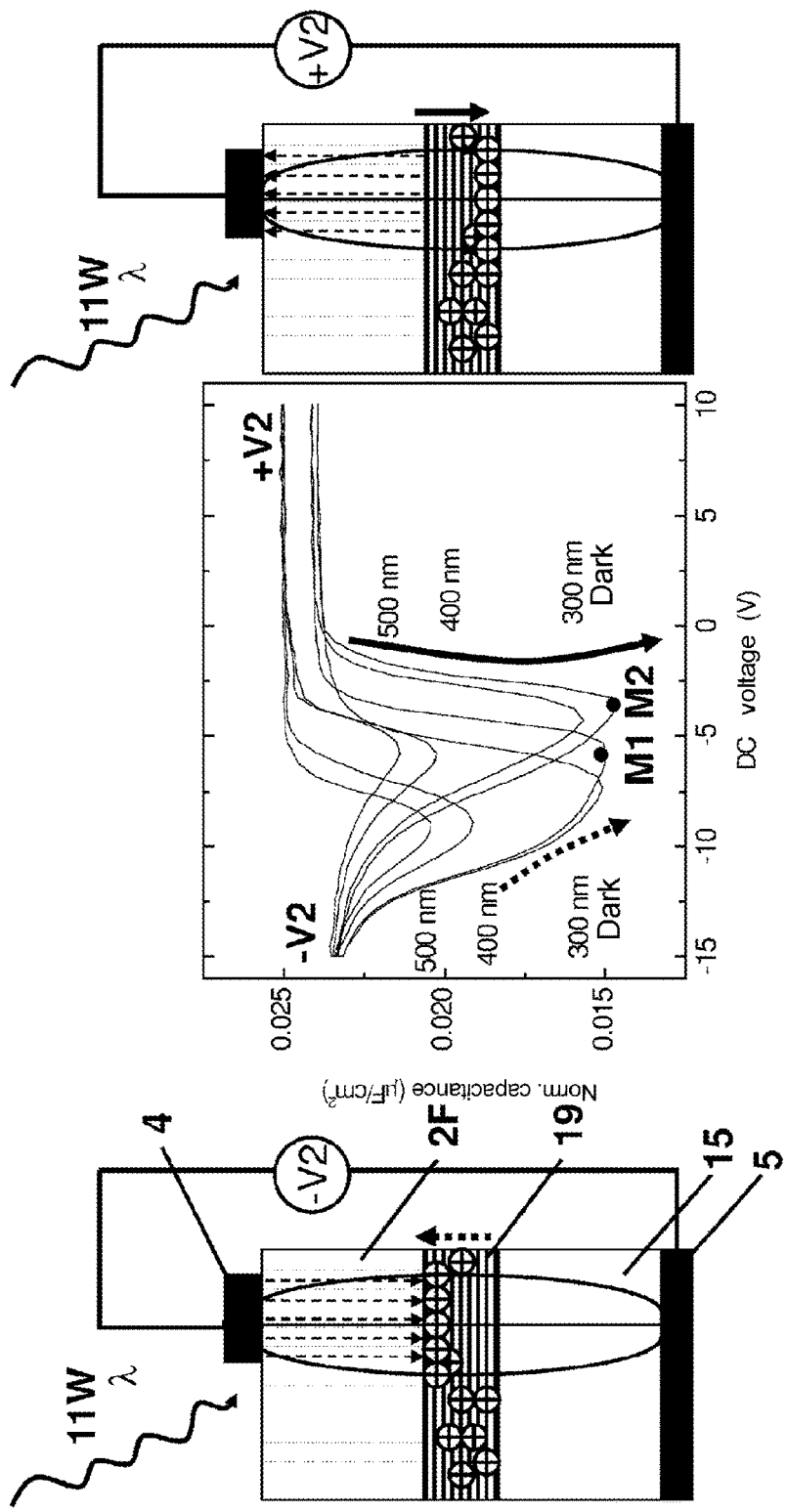
FIGS. 6a, 6b, 6c: show the setup and state of the multilayer system when applying a voltage +V2 and −V2 in the case of irradiation by electromagnetic waves and the associated capacitance-voltage characteristics.

FIGS. 6a to 6c elucidate the capacitance-voltage (CV) characteristics of the multilayer system in the first switching state and in the second switching state when irradiated by electromagnetic waves 11W in a manner dependent on the start point of the externally applied voltage V for different wavelengths of the incident radiation. If a negative voltage −V2 is initially applied between the front side contact 4 and the rear side contact 5 (FIG. 6a), e.g. positive charges IC are displaced in the direction toward the interface GFI between the ferroelectric layer 1F and the insulating layer 19 and the flatband voltage is less than in the case of uniformly distributed charges IC in the insulator 19. The corresponding CV curve has a minimum M1 and the position of the minimum depends on the wavelength λ of the employed light (FIG. 6b).

If a positive voltage +V2 is initially applied between the front side contact 4 and the rear side contact 5 (FIG. 6c), e.g. positive charges IC are displaced in the direction toward the interface GIS between the insulating layer 19 and the doped semiconductor material 15 and the flatband voltage is greater than in the case of uniformly distributed charges IC in the insulator 19. The corresponding CV curve has a minimum M2 and the position of the minimum depends on the wavelength λ of the employed light (FIG. 6b).

By way of example, when using $BiFeO_3$ as ferroelectric material, SiN as insulator with positive charges (in the form of charged impurities) and p-conducting silicon as a semiconductor material, the minimum M1 and the minimum M2 are displaced to smaller voltage values with increasing wavelength A in the case of irradiation with monochromatic light with the same intensity and different wavelengths A (FIG. 6b). In another example, when using $BiFeO_3$ as ferroelectric material, SiN as insulator with positive charges and p-conducting silicon as a semiconductor material, both the minimum M1 and the minimum M2 lie at unchanging voltage values $U_{1,min}$ and $U_{2,min}$ in the case of irradiation with monochromatic light with different intensities and the same wavelength A, but the capacitance value $C_{1,min}$ and $C_{2,min}$ is shifted to higher values with increasing intensity (not shown here). The capacitance value of the minimum M1 and at the minimum M2 can be set in a value range between the smallest capacitance value (no irradiation) and the largest possible capacitance value (saturated irradiation) by varying the light intensity.

By way of example, the top electrode 4 and/or the counter electrode 5 can be designed to be transparent for the radiation to be detected for improved detection of the radiation.

FIGS. 7a to 7c show how the two possible extremal distributions of the charges IC in the insulator 19 are set by a single application of a voltage pulse with the amplitude −V2 (FIG. 7a) or with the amplitude +V2 (FIG. 7c), even in the case of irradiation with monochromatic light (here, with a wavelength λ=300 nm) and constant light intensity. This voltage pulse is once again referred to as write voltage $U_{write}$. FIG. 7b1 shows that the capacitance of the multilayer system is not changed when applying a DC voltage with the small value $U_{1,min}$ or $U_{2,min}$, at which the CV curve has the minimum M1 or the minimum M2 in the case of irradiation with λ=300 nm. By way of example, if the write voltage pulse −V2 is applied, the CV curve of the multilayer system has the minimum M1 and the capacitance read with a read-out voltage $U_{read}=U_{1,min}$ of the minimum M1 is less than the capacitance read out with a read-out voltage $U_{read}=U_{2,min}$ of the minimum M2. By way of example, if the write voltage pulse +V2 is applied, the CV curve of the multilayer system has the minimum M2 and the capacitance read with a read-out voltage $U_{read}=U_{2,min}$ of the minimum M2 is less than the capacitance read out with a read-out voltage $U_{read}=U_{1,min}$ of the minimum M1. FIG. 7b2 shows that the two possible extremal distributions of the charges IC in the insulator 19 are set in nonvolatile fashion and not changed by applying the read-out voltage on a timescale greater than 300 minutes, even in the case of irradiation with λ=300 nm.

FIGS. 8a to 8c show a multilayer system with a top contact 4 permeable to particles (FIG. 8b). The two possible extremal distributions of the charges IC in the insulator 19 are once again set by a single application of a write pulse $U_{write}$ with the amplitude −V2 (FIG. 8a) or the amplitude +V2 (FIG. 8c). Each change of the charges IC—e.g. in the number, the charge state and/or the distribution—in the insulator 19 in the case of irradiation with particles 11T influences the two distinguishable capacitance-voltage curves of the multilayer system of the variable capacitance diode 1.

Charged particles can be accelerated or decelerated in the electric field 7F of the ferroelectric material 2F. Moreover, the position of the charge centroid of the impurities IC in the insulator can be influenced in a controlled manner by introducing additional charged particles in the insulator. By way of example, rare earth ions can be introduced into the insulator by ion implantation into the insulator prior to the application of the ferroelectric layer 1F. If the particles to be detected change the charge state of the rare earth ions, then there is also a change in the extremal distribution of the charges IC in the insulator 19.

Accordingly, the variable capacitance diode 1 can act e.g. as a detector element for detecting radiation incident thereon, wherein the detector element can be placed into a defined state by application of the first switching voltage −V2 or the second switching voltage +V2 and wherein the radiation incident on the variable capacitance diode is characterizable by detecting and evaluating the capacitance characteristic present (e.g. the position of the minimum of the CV characteristic).

Controlling the charges IC in the insulator of the multilayer system is successful locally if both the top contact 4 and the bottom contact 5 have a structured embodiment. FIGS. 9 to 12 each show crossbar arrays with structured conductive surface contacts 4 and associated, opposing counter contacts 5 which are rotated by 90°. The advantage of this arrangement according to the invention of the definition of the crossbar array is that the non-volatile, irradiation-sensitive capacitance can be read locally at each crossing point at the same time.

The depicted arrangement in each case comprises a semiconductor 15, an insulator 19 and a ferroelectric layer 1F. The ferroelectric layer 1F can be produced by thin-film growth, e.g. by means of magnetron sputtering or by means of pulsed laser plasma deposition at growth temperatures of between 350° C. and 1000° C. However, it is advantageous to produce the ferroelectric layer 1F in the amorphous phase at room temperature by means of magnetron sputtering or by means of pulsed laser plasma deposition and to subsequently recrystallize it on the timescale of milliseconds by means of FLA (flash lamp annealing). As a result, the heat influx into the doped semiconductor and into the substrate 3 is significantly reduced. A rear side electrode 5 is applied to the semiconductor and a front side electrode 4 is applied to the ferroelectric layer. The insulator 19 contains a significant number of charged impurities IC. The thickness of the insulator is at least 1 nm. The thickness of the insulator preferably lies in the range between 50 nm and 500 nm. The ferroelectric layer 1F can be electrically polarized by applying a voltage between the front side electrode 4 and the rear side electrode 5 in such a way that positive (negative) polarization charges are formed at the interface between ferroelectric layer and semiconductor and negative (positive) polarization charges are formed between ferroelectric layer and insulator. The polarization charges in the ferroelectric layer cause a drift of the charged impurities IC. The charge centroid of the drifted impurities is stable. The charge centroid is different for the two polarization states of the ferroelectric layer. The capacitance-voltage curve (C-V) of the whole arrangement is similar to the C-V curve of a metal-insulator-semiconductor structure and depends on the position of the charge centroid in the insulator. The charge state of the impurities in the interface between ferroelectric and dielectric layers GFI and in the interface between the dielectric and semiconducting layers GIS is stable in the variable capacitance diode. In the voltage range described as a flatband voltage of a metal-insulator-semiconductor structure, the difference between the two capacitance-voltage curves is particularly large. The values of the two C-V curves approach one another in the voltage region of the accumulation and inversion.

In accordance with the example above, the multilayer system of the variable capacitance diode has a material sequence of electrode, $BiFeO_3$ as ferroelectric, SiN as dielectric, p-Si as doped semiconductor, electrode. However, provision can also be made of e.g. using $YMnO_3$ as ferroelectric instead of using $BiFeO_3$ as ferroelectric. The electrodes can consist of e.g. aluminum or gold; in particular, provision can be made for the first electrode to consist of aluminum and for the second electrode to consist of gold.

The arrangements elucidated in the figures can be used as capacitance for storing binary information. The write voltage polarizes the ferroelectric layer and stabilizes one of the two charge centroids in the insulator. The information is read by measuring the capacitance by applying a read-out voltage from the region of the flatband range. The storage state, i.e. the polarization state of the ferroelectric layer and hence also the position of the stabilized charge centroid, is not changed by measuring the capacitance at the read-out voltage.

The arrangements elucidated in the figures can moreover be used in the case of irradiation with electromagnetic waves and/or particles as detector for detection of same, for example when using at least one electrode 4, 5 transparent to electromagnetic waves and/or particles. In the case of monochromatic illumination, the voltage values $U_{1,min}$ and $U_{2,min}$ of the C-V curves, at which the minima of the two C-V curves respectively occur, change when the wavelength of the electromagnetic wave changes. An increase in the light intensity in the case of an unchanging wavelength increases the value of the capacitance $C_{1,min}$ and $C_{2,min}$ at the voltage values $U_{1,min}$ and $U_{2,min}$ of the C-V curves, at which the minima of the two C-V curves respectively occur, without changing the voltage value of the respective minimum. Particles incident on the arrangement can change the polarization state of the ferroelectric layer, the concentration and distribution of the impurities in the insulating layer, and the doping of the semiconductor. It is advantageous if the polarization state of the ferroelectric layer is changed by irradiation with particles. The polarization of the ferroelectric layer can be restored after the particle detection by a repeated write pulse.

What is advantageous in the case of an arrangement as an individual pixel is that, for example, the change in the photocapacitance corresponds to the spectral response and, in the case of constant luminous intensity and in comparison with the standard CCD, only depends on the wavelength of the electromagnetic wave and not on the signal integration time (accumulation of photo-generated charges in the standard CCD and measurement of the photocapacitance of the illuminated arrangement).

What is advantageous in the case of the arrangement in a pixel array is that, for example, the readout of the photocapacitance of each pixel can take place simultaneously in the case of a test frequency of up to several MHz. As result, it is possible to record up to 1-10 million images per minute (whereas the line-by-line readout of the photo-generated charges in standard CCDs limits the frequency with which the information can be read). On account of the isolatability of each individual pixel from the neighboring pixel, the lateral resolution of the arrangement in the case of the parallel readout of the photocapacitance is greater than the lateral resolution of a standard CCD (in particular since pixels of a line of the pixel array need not be electrically connected). The photocapacitance of a pixel returns to the initial value after switching off the illumination by electromagnetic waves, i.e. it returns to the value of the photocapacitance of the pixel in the dark case (whereas a reset operation needs to be carried out in the case of standard CCDs in order to prevent an overflow of accumulated photo-generated charges).

LIST OF USED REFERENCE SIGNS

1 Variable capacitance diode
1F Layer of ferroelectric material
2F Portion of the ferroelectric layer covered by the first electrode
3 Substrate
4 First electrode/front contact
5 Second electrode/counter contact
7F Electric field lines in the ferroelectric layer
7I Electric field lines in the dielectric layer
7S Electric field lines in the semiconducting layer
11 Radiation
11W Radiation of electromagnetic waves
11T Radiation of particles
15 Layer made of doped semiconductor material
19 Layer made of dielectric material
IC Charged impurities in the dielectric layer
$C_I$ Capacitance of the dielectric layer
$C_S$ Capacitance of the depletion region of the semiconductor layer without radiation
$C_{S11}$ Capacitance of the depletion region of the semiconductor layer with radiation
GFI Interface between ferroelectric and dielectric layers
GIS Interface between dielectric and semiconducting layers
$-V2$, $-V2_j$ External voltage applied to the two electrodes of the variable capacitance diode with the negative terminal at the front contact and with a magnitude at which the coercivity field strength of the ferroelectric material is exceeded
$+V2$, $+V2_j$ External voltage applied to the two electrodes of the variable capacitance diode with the positive terminal at the front contact and with a magnitude at which the coercivity field strength of the ferroelectric material is exceeded
M1, $M1_j$ Minimum of the capacitance voltage characteristic of the variable capacitance diode after applying a voltage $-V2$, $-V2_j$ to the electrodes of the variable capacitance diode
M2, $M2_j$ Minimum of the capacitance voltage characteristic of the variable capacitance diode after applying the voltage $+V2$, $+V2_j$ to the electrodes of the variable capacitance diode
$U_{1,min}$, $U_{1j,min}$ DC read-out voltage for reading the capacitance at the minimum M1, $M1_j$ of the capacitance characteristic
$U_{2,min}$, $U_{2j,min}$ DC read-out voltage for reading the capacitance at the minimum M1, $M1_j$ of the capacitance characteristic

The invention claimed is:

1. A detector for detecting radiation, the detector, comprising:
at least one variable capacitance diode as a detector element, the at least one variable capacitance diode including:
a first electrode and a second electrode; and
a layer configuration disposed in contact-making fashion between said first electrode and said second electrode;
said layer configuration having, in succession in a direction from said first electrode to said second electrode, a layer made of a ferroelectric material and an electrically insulating layer made of a dielectric material, said layer made of said dielectric material having electrically charged impurities; and
means for detecting a capacitance of said at least one variable capacitance diode and characterizing the radiation on a basis of the detected capacitance.

2. The detector according to claim 1, wherein said layer configuration has, in succession in said direction from said first electrode to said second electrode, said layer made of said ferroelectric material, said layer made of said dielectric material and a layer made of a doped semiconductor material.

3. The detector according to claim 1, wherein said layer made of said dielectric material has a thickness of at least 5 nm.

4. The detector according to claim 1, wherein:
said layer made of said ferroelectric material has a polarization surface charge density at an interface thereof in a polarized state, corresponding to a state after applying a coercivity field strength of said ferroelectric material over said layer made of said ferroelectric material;
said layer made of said dielectric material has a volume charge density of electrically charged defects; and
said layer made of said dielectric material has a thickness causing a product of said thickness and said volume charge density of said layer made of said dielectric material, in terms of magnitude, to at most equal said polarization surface charge density of said layer made of said ferroelectric material.

5. The detector according to claim 1, wherein the radiation is particle radiation or electromagnetic radiation.

6. The detector according to claim 1, wherein:
the detector is configured to apply a switching voltage between said first electrode and said second electrode; and
said switching voltage has a magnitude being at least so large that:
a coercivity field strength of said ferroelectric material is exceeded in said layer made of said ferroelectric material, such that:
said at least one capacitance diode can be put into a predetermined storage state with a defined capacitance characteristic by applying said switching voltage.

7. The detector according to claim 6, wherein:
said at least one capacitance diode has a capacitance-voltage characteristic with a minimum in said predetermined storage state; and
the detector is embodied to characterize the radiation on a basis of a position of said minimum.

* * * * *